(12) United States Patent
Behfar (10) Patent No.: US 7,542,497 B2
(45) Date of Patent: Jun. 2, 2009

(54) ALGAINN-BASED LASERS WITH DOVETAILED RIDGE

(75) Inventor: Alex A. Behfar, Ithaca, NY (US)

(73) Assignee: Binoptics Corporation, Ithaca, NY (US)

( * ) Notice: Subject to any disclaimer, the term of this patent is extended or adjusted under 35 U.S.C. 154(b) by 0 days.

(21) Appl. No.: 11/826,809

(22) Filed: Jul. 18, 2007

(65) Prior Publication Data
US 2008/0019408 A1 Jan. 24, 2008

Related U.S. Application Data

(60) Provisional application No. 60/831,439, filed on Jul. 18, 2006.

(51) Int. Cl.
*H01S 5/00* (2006.01)
(52) U.S. Cl. ............... 372/43.01; 372/45.01; 372/66
(58) Field of Classification Search ............ 372/43.01, 372/45.01
See application file for complete search history.

(56) References Cited

U.S. PATENT DOCUMENTS 5,615,224 A * 3/1997 Cohen .............. 372/36
6,803,605 B2 10/2004 Lindstrom et al.

OTHER PUBLICATIONS

Notification of Transmittal of the International Search Report and the Written Opinion of the International Searching Authority for International App. No. PCT/US2007/016235, mailed Oct. 22, 2008.

* cited by examiner

*Primary Examiner*—Dung T Nguyen
(74) *Attorney, Agent, or Firm*—Jones, Tullar & Cooper, P.C.

(57) ABSTRACT

A process for fabricating lasers capable of emitting blue light wherein a GaN wafer is etched to form laser waveguides and mirrors using a temperature of over 500° C. and an ion beam in excess of 500 V in CAIBE, and wherein said laser waveguide has inwardly angled sidewalls.

9 Claims, 14 Drawing Sheets

ALGAINN-BASED LASERS WITH DOVETAILED RIDGE

This application claims the benefit of U.S. Provisional Patent Application No. 60/831,439, filed Jul. 18, 2006, the disclosure of which is hereby incorporated herein by reference.

BACKGROUND OF THE INVENTION

The present invention relates, in general, to a process for fabricating lasers capable of emitting blue light, and, more particularly, to the fabrication of AlGaInN-based ridge lasers utilizing etched facet technology (EFT) for producing laser devices having a dovetail-shaped ridge cross-section.

Reflective mirrors for edge-emitting semiconductor laser diodes are typically formed at the ends of a laser cavity by mechanical cleaving of a semiconductor crystal. In general, for any semiconductor material, cleaving is an imprecise process compared to photolithography. In addition, it necessitates the handling of fragile bars or miniscule chips for device testing and other subsequent operations. It also tends to be incompatible with monolithic integration because it requires that the wafer be physically broken to obtain fully functional lasers.

Cleaving of GaN is especially problematic. Nichia Chemical first demonstrated GaN-based blue lasers on sapphire substrates in 1995 and has subsequently been able to produce commercially available CW lasers [S. Nakamura, et al. 2000 "The Blue Laser Diode: The Complete Story," Springer-Verlag]. Cleaving is commonly used to form the facets of blue lasers, but the prices of these devices have remained very high. Cleaving the sapphire substrate to form the GaN-based laser facets is particularly difficult, since sapphire has many cleave planes with approximately equal cleave strength within a small angular distance of each other. Because of this, the fracture interface can easily be redirected from one cleavage plane to another, even when perturbations during the cleaving process are small, and when this occurs, the laser is unusable. Despite these problems, sapphire has been the substrate of choice for nitride growth because it is relatively inexpensive and stable during the high temperature processes required for GaN deposition. However, both sapphire and the more expensive SiC substrates are significantly lattice mismatched to GaN, producing high defect densities in the grown material. Free standing GaN substrates are a partial solution, and are just now becoming available, but unlike cubic InP and GaAs, GaN is hexagonal in crystal structure and much harder to cleave. It is therefore expected that cleaving will continue to be a challenging process even with GaN substrates. By using tilted substrates in CAIBE, vertical etched facet blue lasers have been fabricated [Kneissl et al., *Appl. Phys. Lett.* 72, 1539-1541]; however, these lasers were of the stripe or gain-guided kind. Accordingly, there is a need for an improved process for fabricating ridge-type blue lasers in a reliable and cost-effective manner.

A significant factor affecting the yield and cost of GaN-based blue lasers is the lack of availability of laser quality material with low defect density. A few research labs have developed techniques such as epitaxial lateral overgrowth (ELOG) on sapphire that have improved the defect density to the $10^5/cm^2$ level. Because of the difficulty in cleaving, described previously, the minimum cavity length that can be realistically fabricated today is on the order of 600 μm. The use of etched facets in place of mechanically cleaved facets allows the formation of shorter cavity devices of 100 μm or less. The ability to make shorter cavity devices results in a lower probability of having defects in the device and hence produces a much higher yield. These lasers may have a lower maximum power rating than longer cavity devices; however, the vast majority of lasers will be used in next generation DVD read-only applications, where lower power is sufficient and the lowest cost and lowest power consumption will be needed. The specific fabrication, integration and full wafer testing capabilities enabled by EFT will also provide significant benefits to the fabrication of high-power GaN lasers for writable optical disk applications.

Another significant problem encountered with GaN-based lasers is the provision of a good p-contact to this material. Although improvements have been made, the p-contact resistance with this material continues to be more challenging than with other III-V materials. The difficulty is that in order to get a good single lateral mode laser, the ridge for these devices needs to have a width on the order of 1 μm, and forming a good p-contact on such a small width is particularly challenging.

SUMMARY OF THE INVENTION

In view of the attractiveness of an etched-facet blue-emitting laser from a process yield and cost perspective, as well as its potential for the fabrication of integrated AlGaInN-based photonics, a new EFT process has been developed to achieve facet etching in AlGaInN-based structures. Several years ago, a new technology was pioneered [A. Behfar-Rad, et al. 1989 *Appl. Phys. Lett.* 54, 439-495; U.S. Pat. No. 4,851,368]in which laser facets were formed using a process based on photolithography definition of a mask and chemically assisted ion beam etching (CAIBE). BinOptics Corporation of Ithaca, N.Y., has developed commercially available InP-based laser products using this Etched Facet Technology (EFT). These products are characterized by precisely located mirrors that have a quality and reflectivity that are equivalent to those obtained by cleaving. With EFT, lasers are fabricated on the wafer in much the same way that integrated circuit chips are fabricated on silicon. This allows the lasers to be monolithically integrated with other photonic devices on a single chip and to be tested inexpensively at the wafer level [P. Vettiger, et al. 1991 *IEEE J. Quantum Electron.* 27, 1319-13314].

A novel and cost-effective way to build a surface-emitting laser using etched facet technology is described in A. Behfar, et al, 2005 *Photonics West,* pages 5737-08. See also co-pending U.S. patent application Ser. No. 10/958,069 of Alex A. Behfar, entitled "Surface Emitting and Receiving Photonic Devices", filed Oct. 5, 2005; and co-pending U.S. patent application Ser. No. 10/963,739, entitled "Surface Emitting and Receiving Photonic Device With Lens," filed Oct. 14, 2004 of Alex A. Behfar, et al, both assigned to the assignee of the present application, the disclosures of which are hereby incorporated herein by reference. The described horizontal cavity, surface-emitting laser (HCSEL) is in the form of an elongated cavity on a substrate, and is fabricated by etching a 45° angled facet at the emitter end and a 90° facet at the back end of the cavity. The back end reflective region may incorporate an etched distributed Bragg reflector (DBR) adjacent to the rear facet, or dielectric coatings may be used for facet reflectivity modification (FRM). A monitoring photodetector (MPD) and receiver detectors may also be integrated onto the chip, as described in co-pending U.S. patent application Ser. No. 11/037,334, filed Jan. 19, 2005, of Alex A. Behfar, entitled "Integrated Photonic Devices, assigned to the assignee of the present application.

In accordance with the present invention, lasers are fabricated on a wafer in much the same way that integrated circuit chips are fabricated on silicon, so that the chips are formed in full-wafer form. The laser mirrors are etched on the wafer using the EFT process, and the electrical contacts for the lasers are fabricated. The lasers are tested on the wafer, and thereafter the wafer is singulated to separate the lasers for packaging. Scanning Electron Microscope images of etched AlGaInN-based facets show the degree of verticality and smoothness achieved using newly developed EFT process of the present invention. The present invention allows lasers and integrated devices for a variety of applications with wavelength requirements accessible with AlGaInN-based materials.

The process for fabricating lasers in accordance with the present invention may be summarized as comprising the steps of etching a wafer having an AlGaInN-based structure to fabricate a multiplicity of laser waveguide cavities on the wafer and then etching the laser cavities to form laser facets, or mirrors, on the ends of the waveguides while they are still on the wafer. Thereafter, electrical contacts are formed on the laser cavities, the individual lasers are tested on the wafer, and the wafer is singulated to separate the lasers for packaging. In accordance with the invention, the method of etching the facets includes using a high temperature stable mask on a p-doped cap layer of the AlGaInN-based laser waveguide structures on the wafer to define the locations of the facets, with the mask maintaining the conductivity of the cap layer, and then etching the facets in the laser structure through the mask using a temperature over 500° C. and an ion beam voltage in excess of 500V in CAIBE.

Selectivity between the etching of the semiconductor and the masking material is very important in obtaining straight surfaces for use in photonics. High selectivity between the mask and the GaN based substrate was obtained, in accordance with the present invention, by performing CAIBE at high temperatures. Large ion beam voltages in CAIBE were also found to enhance the selectivity. The mask materials were chosen to withstand the high temperature etching, but also to prevent damage to the p-contact of the GaN-based structure.

In order to overcome the difficulty in providing a p-contact for the above-described lasers, a ridge is formed by using two CAIBE ridge-etching steps instead of the single ridge-forming step described above. In the first step, the CAIBE is performed on one side of the ridge at an angle of between about 40° and about 60°. The second CAIBE step is performed on the opposite side of the ridge, also at an angle of between about 40° and about 60°, but in the opposite direction, so that the ridge is formed with a dovetailed cross-section having a wide top surface and a narrow base.

BRIEF DESCRIPTION OF THE DRAWINGS

The foregoing, and additional objects, features and advantages of the invention will become apparent to those of skill in the art from the following detailed description of the invention taken with the accompanying drawings, in which.

DETAILED DESCRIPTION OF THE INVENTION

Figure 1:
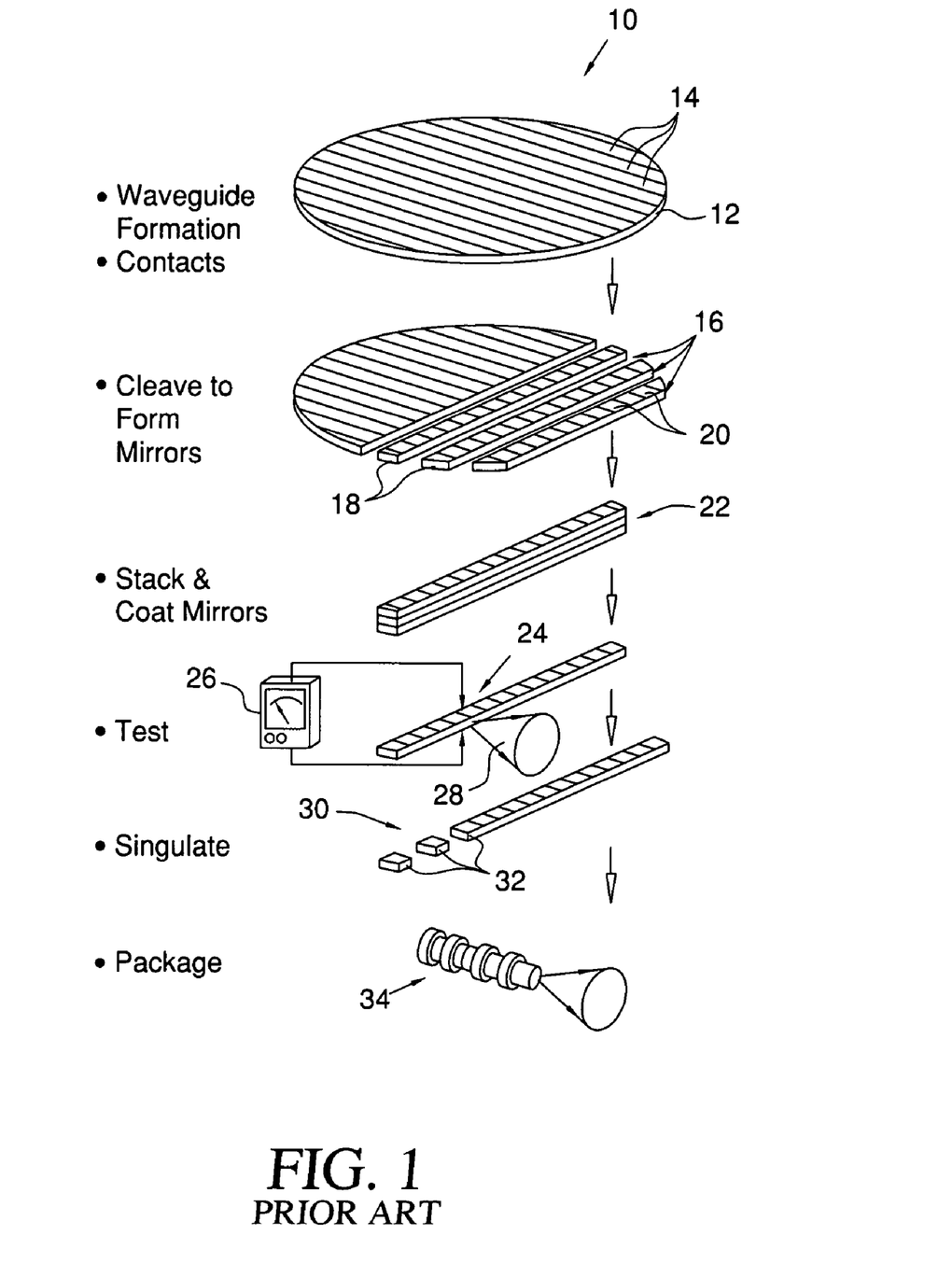
FIG. 1 illustrates a prior art laser fabrication process, wherein laser facets are cleaved.

As generally illustrated at 10 in FIG. 1, mechanical cleaving of a semiconductor epi wafer 12 is the usual process for defining reflective mirrors, or facets, at the cavity ends of edge-emitting diode lasers. In this process, multiple waveguides 14 are fabricated on the wafer substrate, a metal contact layer is applied, and the wafer is mechanically cleaved, as along cleave lines 16, to form bars 18 of laser devices 20. The bars 18 are then stacked, as illustrated at 22, and the cleaved end facets of the laser devices are coated to provide the desired reflection and emission characteristics. The individual laser devices 20 may then be tested, as at 24, by applying a bias voltage 26 across the individual lasers, and detecting the resulting output light beam 28. The bars of laser devices may then be separated, or singulated, as at 30, to produce individual chips 32 that may be suitably packaged, in known manner, as at 34.

For most semiconductor devices, however, the foregoing cleaving process is imprecise, for it relies on the location and angle of the crystalline planes of the semiconductor material. With some materials, for example, there may be cleave planes of approximately equal strength that are oriented at such acute angles to one another that minute perturbations occurring during cleaving can redirect a fracture interface from one cleave plane to another. Furthermore, the cleaving process illustrated in FIG. 1 creates fragile bars and minuscule chips that are awkward to handle during testing and packaging. In addition, mechanical cleaving tends to be incompatible with later processing of the individual chips, as would be needed to provide a monolithic integration of components on a chip, for example, since the wafer must physically be broken to obtain fully functional lasers.

Figure 2:
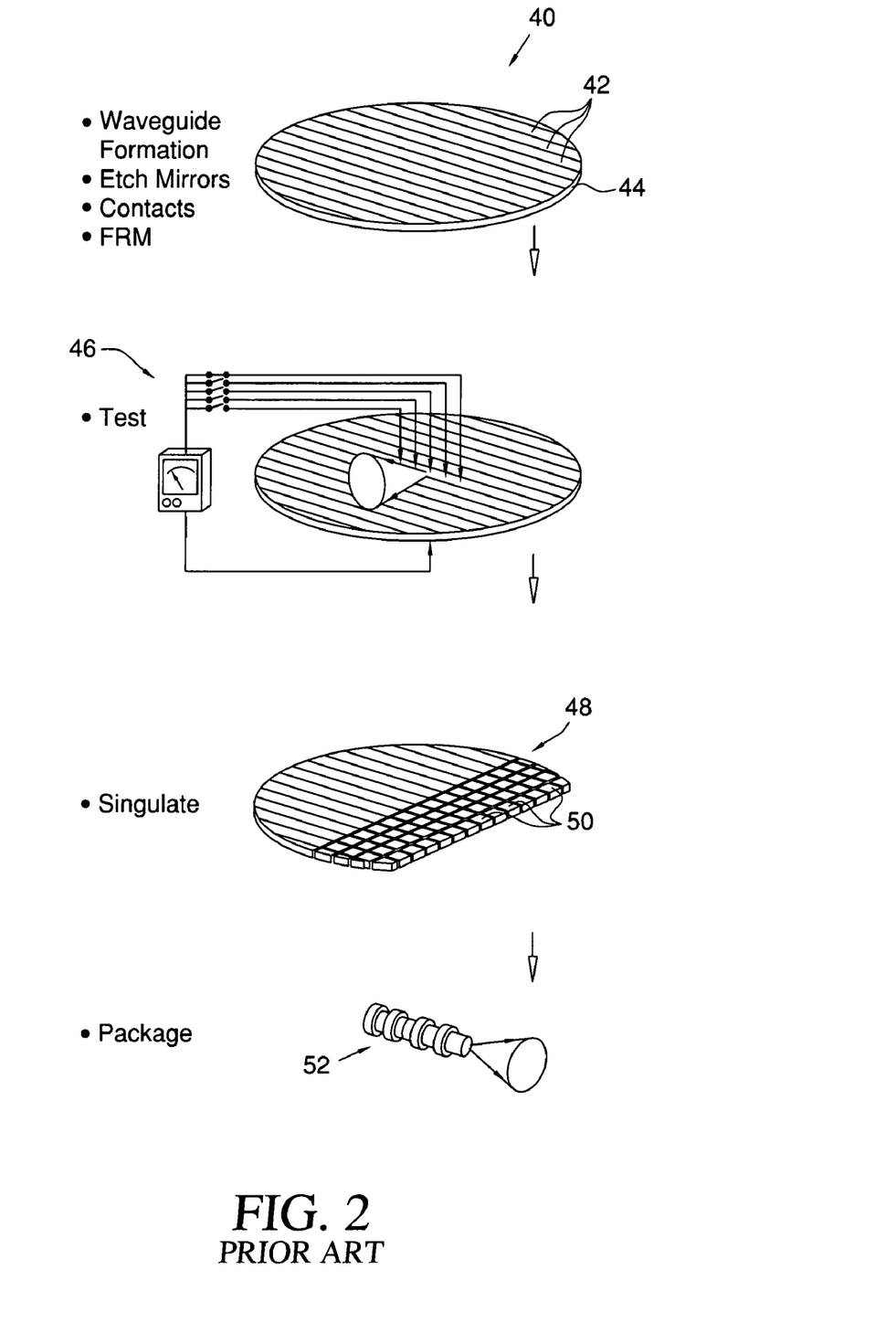
FIG. 2 illustrates a prior art laser fabrication process with on-wafer testing made possible by etching of the laser facets.

An alternative prior art technology for fabricating photonic devices such as lasers is generally illustrated at 40 in FIG. 2, wherein multiple waveguides 42 are fabricated on a suitable wafer substrate 44. These are preferably parallel waveguides that extend across the wafer, as illustrated. A process based on photolithography and chemically-assisted ion-beam etching (CAIBE) is then used to form facets at desired locations along the waveguides to produce laser waveguide cavities. These facets are precisely located, and have a quality and reflectivity that is equivalent to those obtained by cleaving. Since the laser cavities and facets are fabricated on the wafer much the same way that integrated circuits are fabricated on silicon, this process allows the lasers to be monolithically integrated with other photonic devices on a single chip, and allows the devices to be tested inexpensively while still on the wafer, as indicated at 46. Thereafter, the wafer may be singulated, as at 48, to separate the chips 50, and the chips may then be packaged, as illustrated at 52. This process has a high yield and low cost, and also allows the manufacture of lasers having very short cavities. The prior art fabrication process of FIG. 2 is described in greater detail in "Monolithic AlGaAs—GaAs Single Quantum-Well Ridge Lasers Fabricated with Dry-Etched Facets and Ridges", A. Behfar-Rad and S. S. Wong, IEEE Journal of Quantum Electronics, Vol. 28, pp. 1227-1231, May 1992.

In accordance with the present invention, lasers are fabricated utilizing the general process illustrated in FIG. 2, but on a wafer with an AlGaInN-based epitaxial structure 44, in much the same way that integrated circuit chips are fabricated on silicon, so that the chips are formed in full-wafer form. The laser mirrors are etched on the wafer using the new etched facet technology (EFT) of the invention, and the electrical contacts for the lasers are fabricated on the laser cavities on the wafer. The lasers are tested on the wafer, and thereafter the wafer is singulated to separate the lasers for packaging, in the manner described above. Scanning Electron Microscope images of etched AlGaInN-based facets show that a high degree of verticality and smoothness can be achieved using the EFT process of the present invention. The present invention permits the fabrication of lasers and integrated devices for a variety of applications having wavelength requirements accessible by AlGaInN-based materials.

As will be described in greater detail below, in the process of the present invention, a AlGaInN-based laser structure is epitaxially deposited on a substrate and contains a lower cladding of n-doped AlGaN, an active region with quantum wells and barriers of AlGaInN (Al and/or In can be zero in this composition), an upper cladding layer of p-doped AlGaN, and a highly p-doped cap layer of GaN and/or GaInN.

A layer of PECVD $SiO_2$ is deposited on the nitride-based laser structure. Lithography and RIE is performed to pattern the $SiO_2$ to provide an $SiO_2$ mask that is used to define laser facets and laser mesas. For each laser, a ridge is formed, first by lithography and removal of $SiO_2$ in regions other than the location of the ridge through RIE, and then through CAIBE, which is once again used to form the ridges. The samples are encapsulated with PECVD $SiO_2$, a contact opening is formed, and a p-contact is formed on top of the wafer, followed by the n-contact on the bottom.

Figure 3:
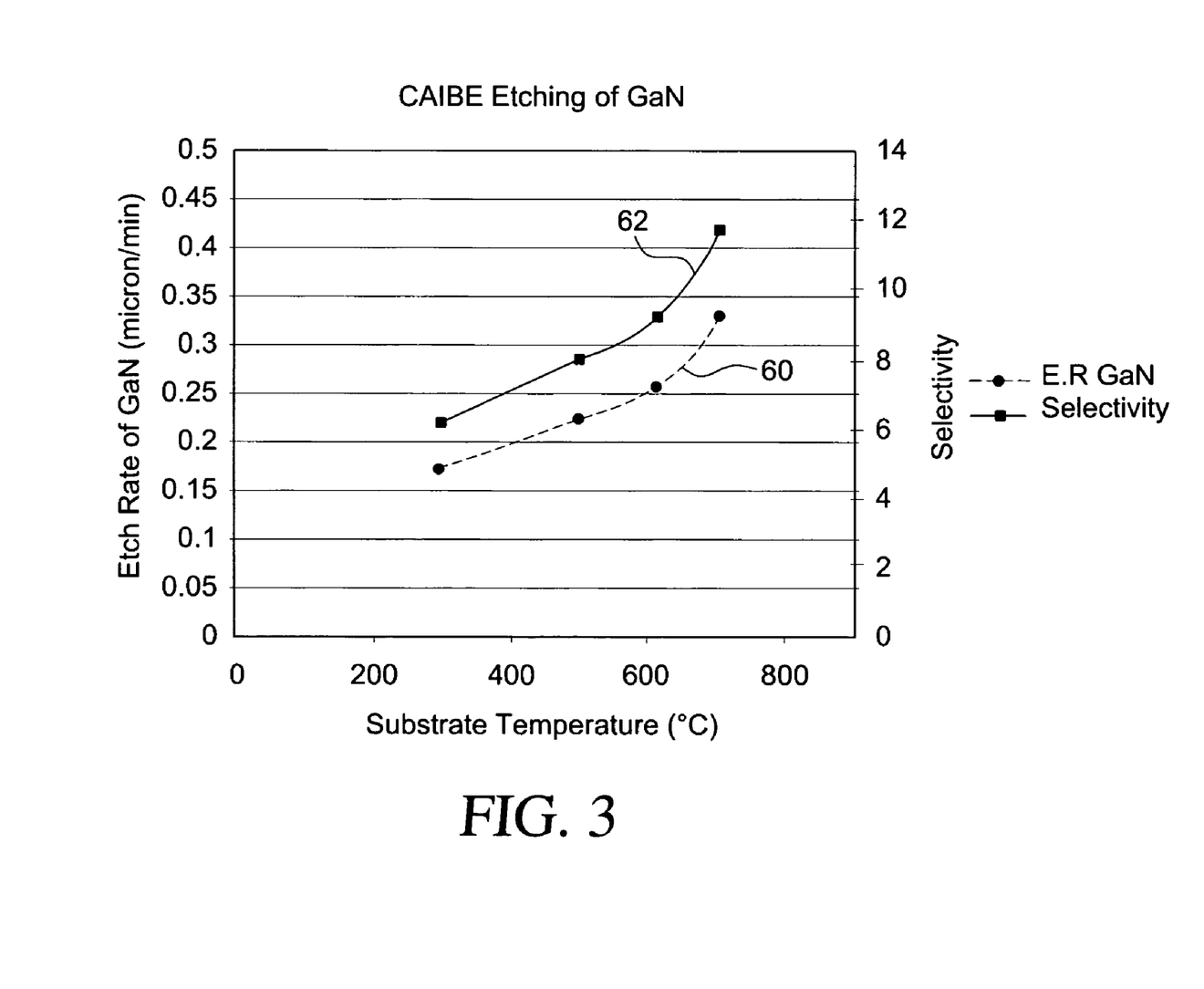
FIG. 3 is a graph illustrating the effect of temperature in CAIBE at constant ion beam current density and voltage on GaN etch rate and on the selectivity of the etching of GaN to erosion of the SiO$_2$ mask.

In a preferred form of the process of the invention, the etching in CAIBE is carried out at a temperature of between about 500° C. and about 700° C., and with an ion beam voltage of between 500 V and 2000 V to provide improved selectivity. FIG. 3 illustrates at curve 60 the effect on the etch rate, or etch rate gain, of GaN with temperature in CAIBE while the ion beam voltage, beam current density, and the flow of Chlorine are kept constant at 1100 V, 0.35 $mA/cm^2$, and 20 sccm. This figure also illustrates at curve 62 the etch selectivity between GaN and the $SiO_2$, and shows that the selectivity improves with increasing temperature with a selectivity of over 10:1 being obtained around 700° C. However, at temperatures of beyond 700° C., the GaN facet begins to exhibit a pitting behavior and this pitting is exacerbated at higher temperatures.

Figure 4:
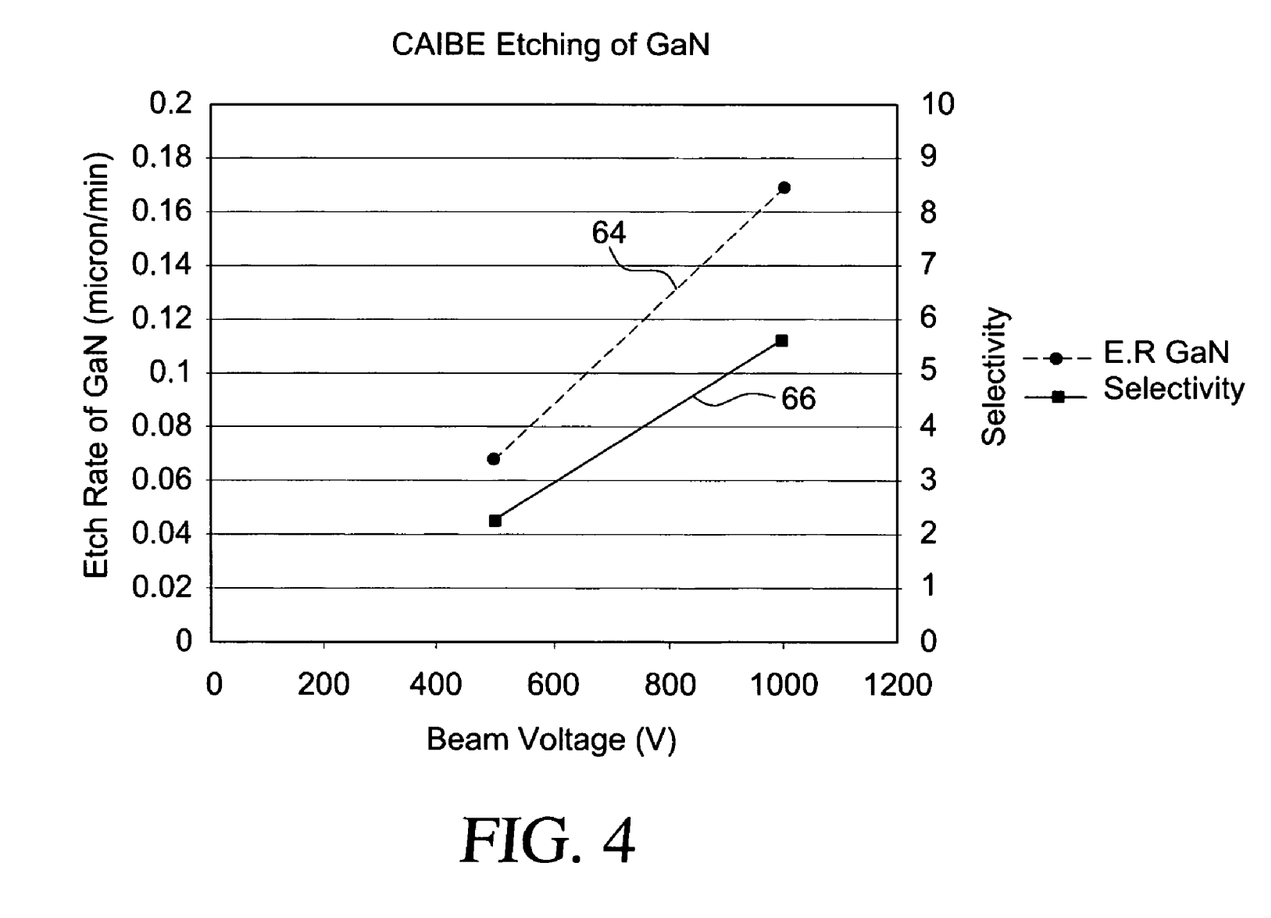
FIG. 4 is a graph illustrating the effect of ion beam voltage in CAIBE at constant temperature and constant ion beam current density on GaN etch rate and on the selectivity of the etching of GaN to erosion of the SiO$_2$ mask.

FIG. 4 illustrates at curve 64 the effect on the etch rate of GaN with beam voltage in CAIBE while the temperature, ion beam current density, and the flow of Chlorine are kept constant at 275° C., 0.30 $mA/cm^2$, and 20 sccm. This figure also illustrates at curve 66 the etch selectivity between GaN and the $SiO_2$, and shows that the selectivity improves with increasing beam voltage.

Figure 5:
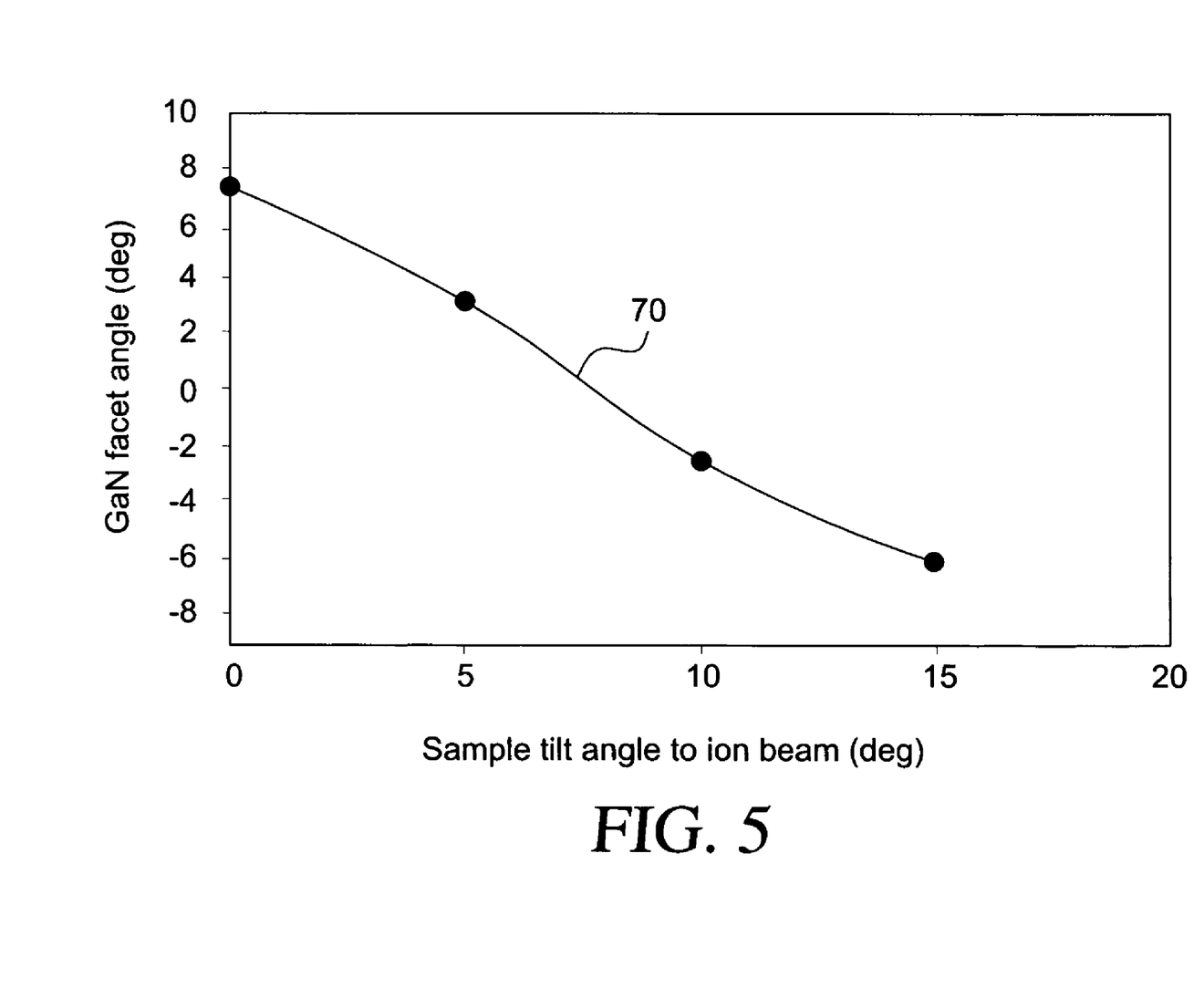
FIG. 5 shows the angle of the GaN facet with respect to the normal to the substrate with the different tilt angles used during CAIBE.

Under CAIBE conditions where lower etch selectivity between GaN and the $SiO_2$ is obtained, the etched facet may be formed at an angle away from the perpendicular to the substrate, but this can be compensated for by etching at an angle in the CAIBE system. In this case, the sample is positioned at an angle to the ion beam that is away from perpendicular incidence. Curve 70 in FIG. 5 shows the facet angle as a function of the tilt in the CAIBE sample holder stage. The conditions used for generating the data in FIG. 5 were an ion beam voltage of 1250 V; ion current density of 0.3 $mA/cm^2$; 20 sccm flow of $Cl_2$; and substrate stage temperature of 700° C.

Figure 6:
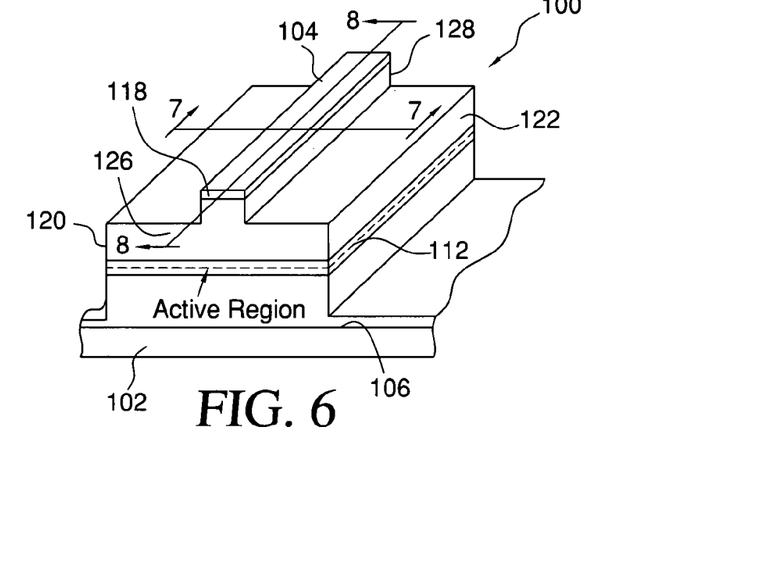
FIGS. 6-18 illustrate a process for fabrication of nitride-based ridge lasers with vertical facets using three etching steps in CAIBE, in accordance with the present invention.

Turning now to a more detailed description of the process of the invention, a Fabry-Perot laser waveguide 100, shown in perspective view in FIG. 6, is fabricated using the process steps of FIGS. 7 to 18, wherein a process for fabricating a highly reliable AlGaInN-based blue laser waveguide on a substrate 102 is illustrated. Although the invention will be described in terms of a laser having a ridge such as that illustrated in FIG. 6 at 104, it will be understood that other types of lasers or other photonic devices may also be fabricated using this process.

Figure 7:
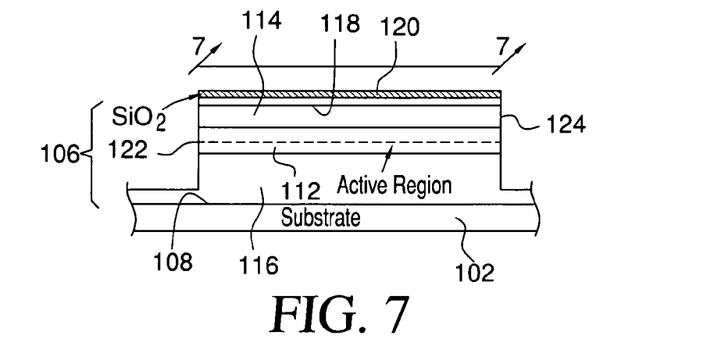
Figure 8:
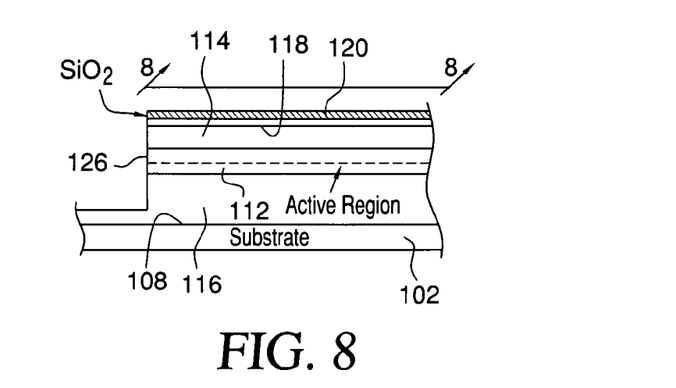
Figure 9:
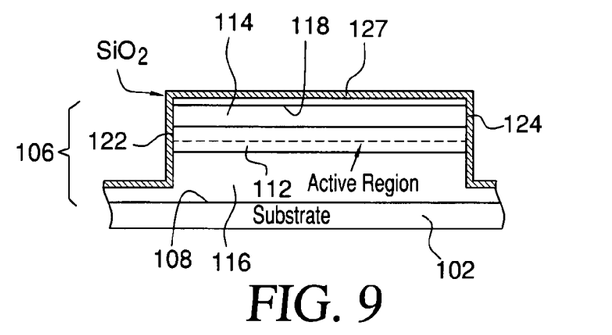

As is conventional, the substrate 102 may be a wafer formed, for example, of a type III-V type compound, or an alloy thereof, which may be suitably doped. As illustrated in FIGS. 7 and 8, which are views of the device of FIG. 6 taken in the direction of lines 7-7 and 8-8, respectively, a succession of layers 106 may be deposited on a top surface 108 of the substrate 102, as by epitaxial deposition using Metalorganic Chemical Vapor Deposition (MOCVD) or Molecular Beam Epitaxy (MBE), for example. These layers may then be etched to form optical waveguides, such as the waveguides 42 illustrated in FIG. 2 or the waveguide 100 illustrated in FIG. 6, that typically include an active region 112 and upper and lower cladding regions 114 and 116, as illustrated in FIGS. 7 and 8. It is noted that FIGS. 7, 9, 11, 13 and 15 are end views taken in the direction of the arrows 7-7 of the waveguide 100 of FIG. 6, while FIGS. 8, 10, 12, 14 and 16 are cross-sectional views of the waveguide 100 taken in the direction of arrows 8-8 of FIG. 6.

In one example, the layers 106 of the AlGaInN-based semiconductor laser photonic device 100 were epitaxially formed on an n-doped GaN substrate 102, and contained a lower cladding region 116 of n-doped AlGaN, an active region 112 with quantum wells and barriers of AlGaInN (Al and/or In can be zero in this composition), an upper cladding layer 114 of p-doped AlGaN having a thickness t, and a highly p-doped cap layer 118 of GaN and/or GaInN. The upper and lower cladding regions 114 and 116, respectively, of the photonic structure had a lower index than the index of the active region 112, while the GaN and/or GaInN cap layer 118 was provided to allow ohmic contacts. Although this example is based on providing a blue laser device on a GaN substrate, it will be understood that these devices can be formed on other substrates such as Sapphire, SiC or AlN.

Figure 10:
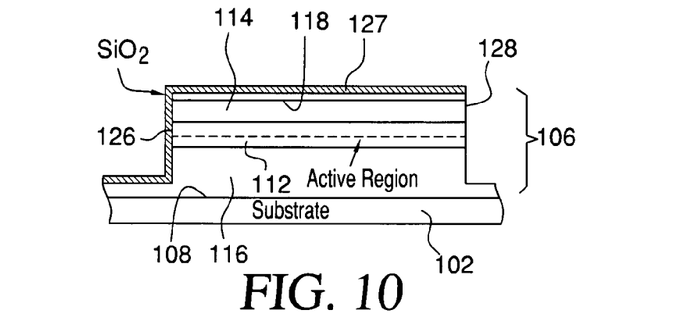

A layer 120 of a dielectric such as $SiO_2$ is deposited on the nitride-based laser structure, as by plasma enhanced chemical vapor deposition (PECVD), photolithography is used to define the position of the facets in a spun-on photoresist layer, and a $CHF_3$ reactive ion etch (RIE) is used to transfer the pattern in the photoresist into the SiO$_2$ to produce a mask. The photoresist is removed with an oxygen plasma and the sample is placed in a Cl$_2$-based chemically assisted ion beam etch (CAIBE) at an appropriate substrate tilt to allow the formation of a first vertical facet 126, as shown in FIG. 8. The CAIBE parameters may be as follows: 1250 eV Xe ions at a current density of 0.3 mA/cm$^2$, Cl$_2$ flow rate of 20 sccm, and a substrate stage temperature of 650° C. The etch is deep enough to form an adequate facet surface for the vertical waveguide of the laser. The remaining SiO$_2$ mask 120 is removed using buffered HF, and a new layer 127 of PECVD SiO$_2$ is deposited on the nitride-based laser structure, covering the first etched vertical facet 126. A second photolithography is used to define the position of a second facet in a photoresist layer, and RIE is used to transfer the photoresist pattern into the SiO$_2$. The photoresist is removed and the sample is placed in CAIBE at an appropriate substrate tilt to allow the formation of the second vertical facet 128, as shown in FIG. 10. As in the case of the first etched facet, the etch for the second facet is deep enough to form an adequate facet surface for the vertical waveguide of the laser. The first facet 126 is protected by the SiO$_2$ mask 127 during the formation of the second facet.

Figure 11:
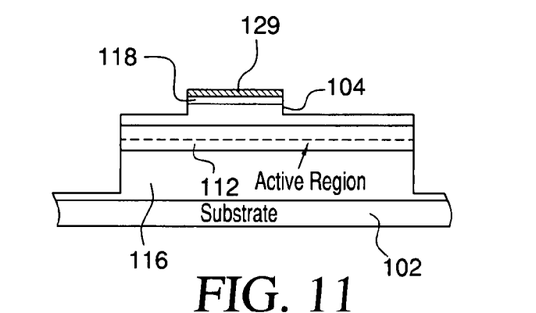
Figure 12:
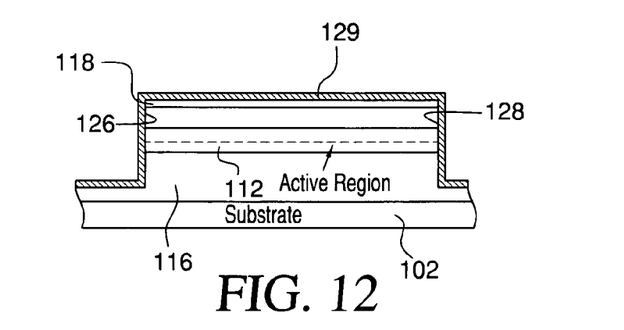

The remaining SiO$_2$ mask 127 is removed and a new layer 129 of PECVD SiO$_2$ is deposited on the nitride-based laser structure, covering the first and second etched vertical facets. Photolithography is used to define the position of the ridge 104 in photoresist and RIE is used to transfer the photoresist pattern into the SiO$_2$ layer 129. The photoresist is removed, and the sample is placed in CAIBE with the substrate essentially perpendicular to the ion beam for the formation of the ridge, as illustrated in FIGS. 11 and 12. The ridge 104 provides lateral waveguiding for the blue laser structure.

Figure 13:
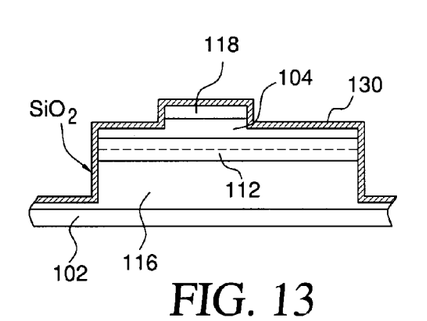
Figure 14:
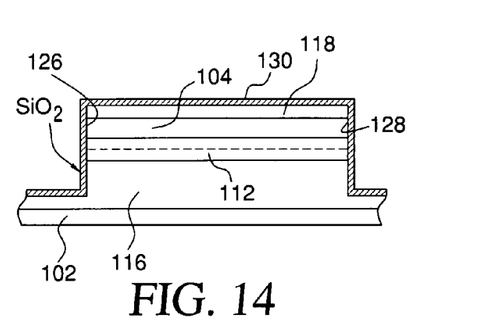
Figure 15:
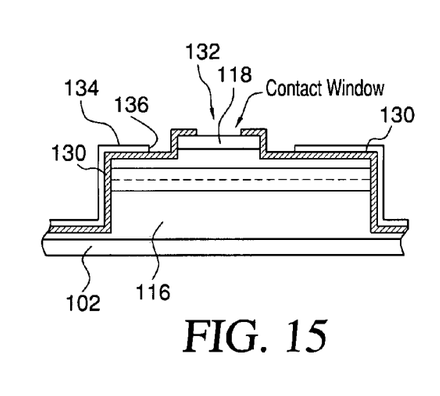
Figure 16:
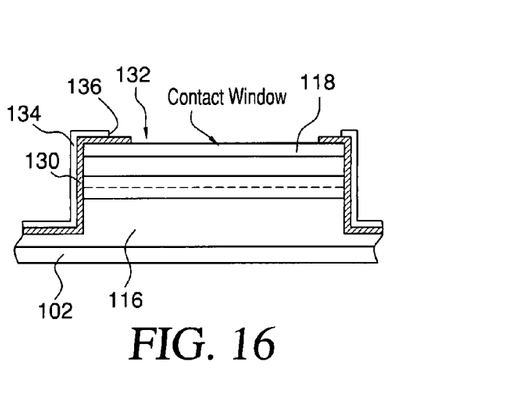
Figures 17, 18:
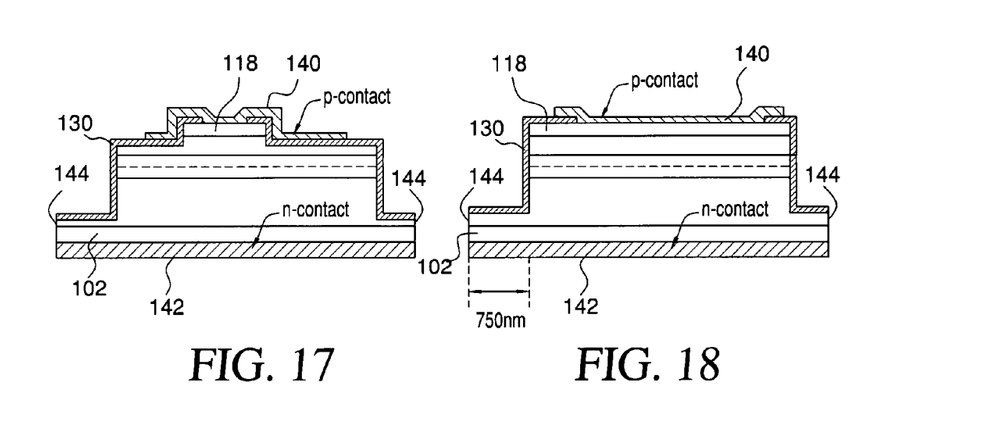

The remaining SiO$_2$ mask 129 is removed and a new layer 130 of PECVD SiO$_2$ is deposited to encapsulate the structure, as shown in FIGS. 13 and 14. Photolithography is used to define the position of an opening 132 on top of the ridge in the photoresist and RIE is used to partially transfer the hole in the photoresist into the SiO$_2$, as illustrated in FIGS. 15 and 16 to form a mask. Residual SiO$_2$ is removed from the opening 132, using buffered HF, so that the highly doped surface of the contact layer 118 of the nitride based laser structure is exposed. In this way, RIE does not damage the surface of the highly doped contact layer 118. A p-contact 140 is deposited, using metallization lift-off pattern 134 as shown in FIGS. 15 and 16, to cover the opening 132, and an n-contact 142 is either formed from the same side as the p-contact using metallization lift-off, or in the case that the substrate is conducting, is deposited on the backside of the wafer, as shown in FIGS. 17 and 18. The edges 136 of the lift-off pattern define the p-contact.

The p-contact may be formed in a two step process where a first deposition of a metal, such as 30 nm of Ni followed by 30 nm of Au, is deposited over the opening is performed through metallization lift-off. The first deposition is annealed using a rapid thermal annealer (RTA) at 550° C. in an O$_2$ ambient to form good contact with the nitride-based structure. Then a second deposition of a metal, such as 15 nm of Ti, 500 nm of Pt, and 1000 nm of Au, is performed also through metallization lift-off to provide better conductivity of the p-metal as well as to provide a better base for wirebonding to the p-contact.

Figures 19, 20:
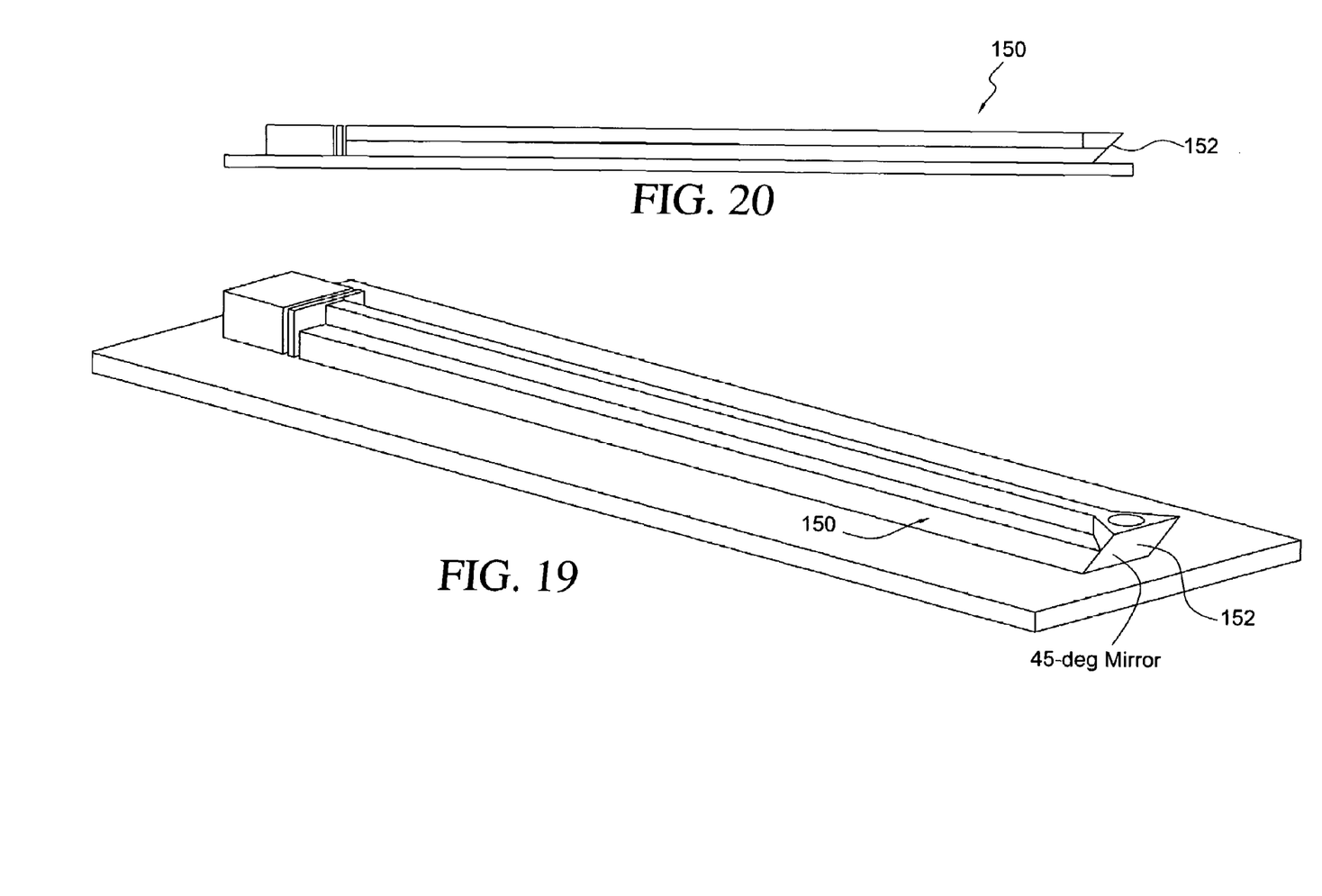
FIG. 19 illustrates in perspective view a horizontal cavity, surface-emitting laser (HCSEL), fabricated in accordance with the EFT process of the present invention.
FIG. 20 is a side view of the laser of FIG. 19.
Figure 21:
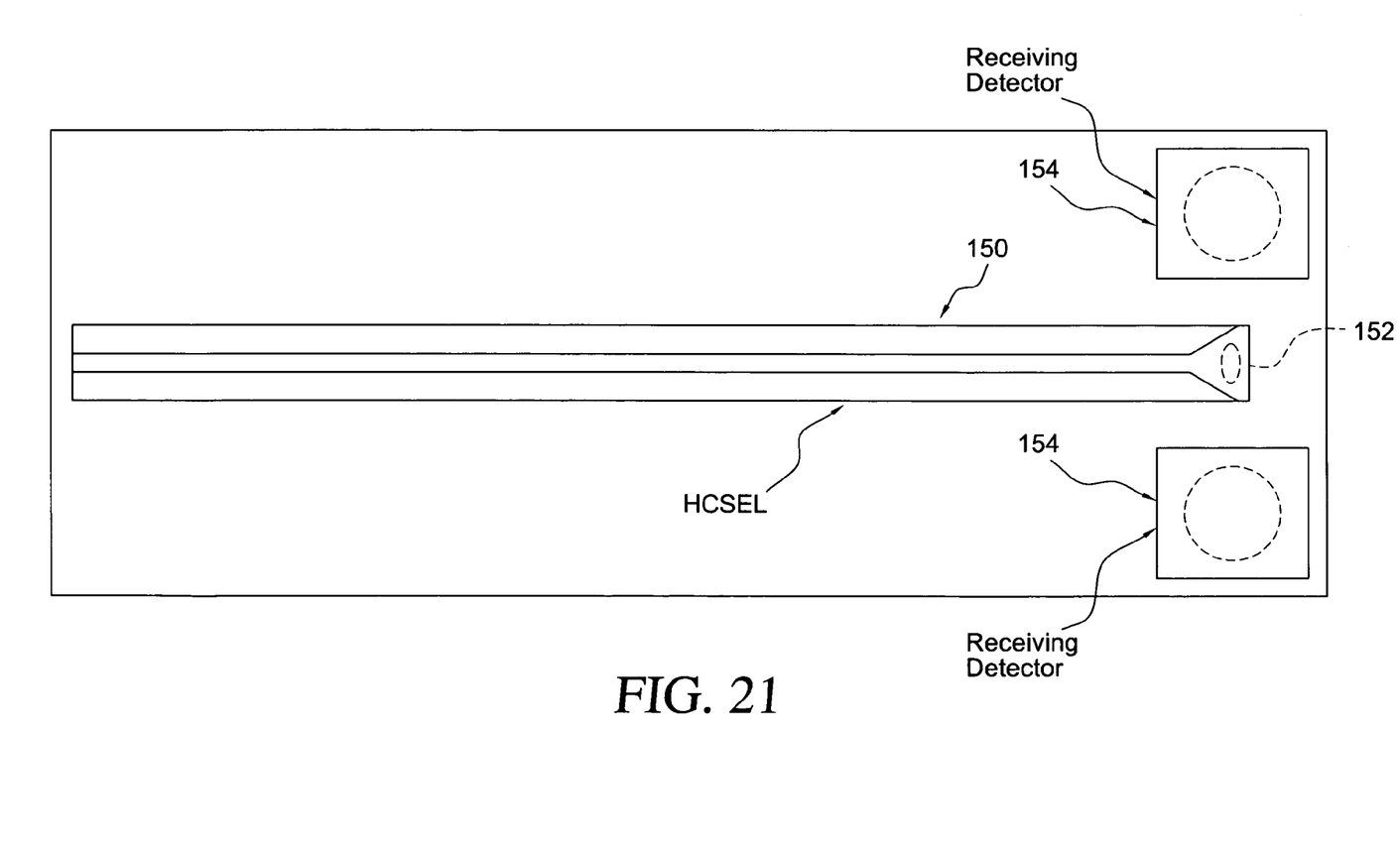
FIG. 21 illustrates the integration of a HCSEL and receiver detectors on a single chip.

The process described with respect to FIGS. 7-10 can be replaced with an angled etch that results in one or both of the facets 126 and 128 being etched at a 45° angle to form a surface emitting device or HCSEL 150, such as that illustrated in FIGS. 19-21. In these Figs., the HCSEL incorporates a single 45° angled facet 152, although both facets can be angled, if desired. As illustrated in FIG. 21, one or more receiving detectors 154 can be integrated with the HCSEL 150.

Figure 22:
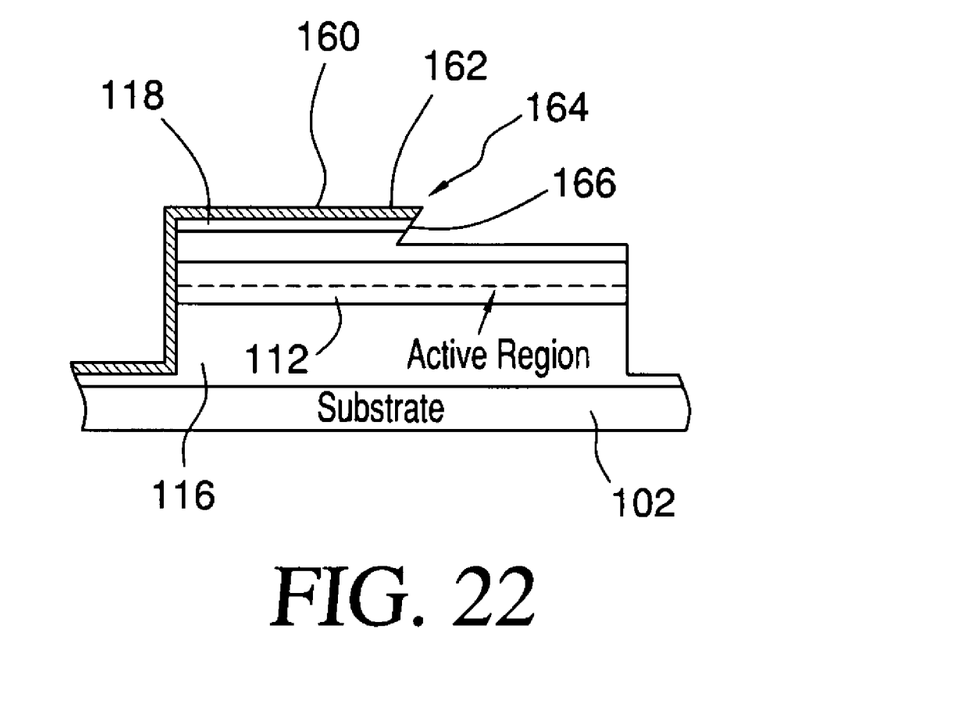
FIGS. 22-26 illustrate a process for fabrication of nitride-based ridge lasers with inwardly tapered sides using two angled etching steps in CAIBE to produce a ridge that is dovetailed in cross-section, in accordance with the present invention.

A modification of the foregoing process is illustrated in FIGS. 22-26, wherein elements in common with FIGS. 11, 13, 15 and 17 are similarly numbered. As illustrated in FIG. 22, after formation of the etched facets, described with respect to FIGS. 9 and 10, a new layer 160 of PECVD SiO$_2$ is deposited on the nitride-based laser structure, covering the top surface 162 of the layer 118 as well as the first and second etched vertical facets 126 and 128. Photolithography is used to define the position of the first side of the ridge 164 in a photoresist layer, and RIE is used to transfer the photoresist pattern into the SiO$_2$ layer 160. The photoresist is removed, and the sample is placed in CAIBE, with the substrate angled with respect to the ion beam for the formation of a first, inwardly angled, side wall 166 of the ridge, as illustrated in FIG. 22.

Figure 23:
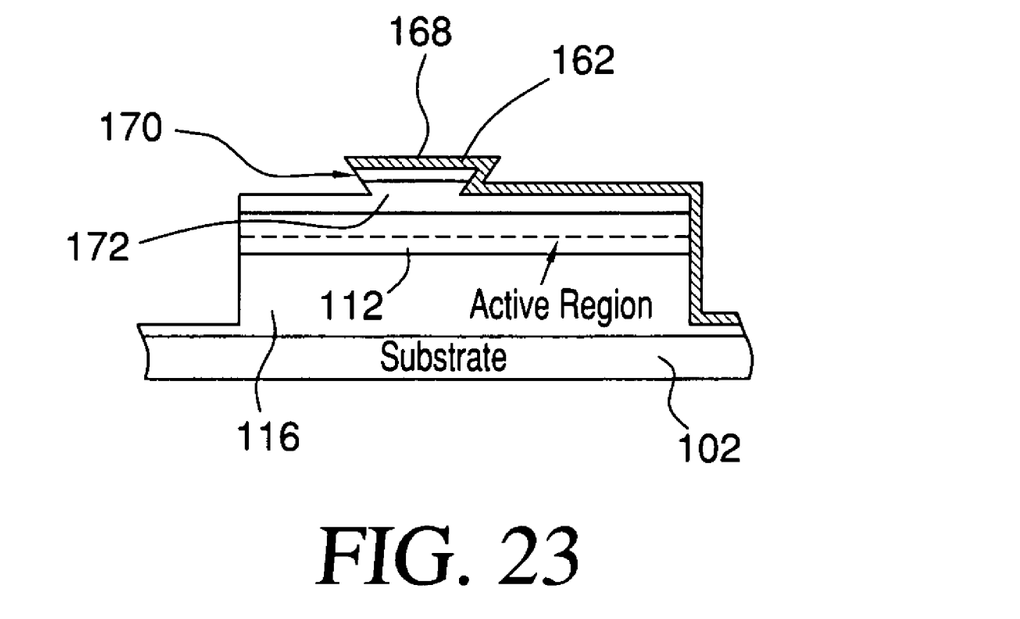

Thereafter, the remaining SiO$_2$ mask 160 is removed, using buffered HF, and another layer 168 (FIG. 23) of PECVD SiO$_2$ is deposited on the laser structure, covering the first and second etched vertical facets at the ends of the ridge and the ridge side wall 166. Photolithography is used to define the position of a second side of the ridge 164 in a photoresist layer, and RIE is then used to transfer the photoresist pattern into the SiO$_2$ layer 168. The photoresist is removed, and the sample is placed in CAIBE with the substrate angled with respect to the ion beam for the formation of a second, inwardly angled, side wall 170 of the ridge, as illustrated in FIG. 23. As illustrated, the side walls 166 and 170 are sloped downwardly and inwardly in opposite directions to provide a dovetailed cross-section for the ridge so that the top surface 162 of the contact layer 118 is wider than the base 172 of the ridge.

Figure 24:
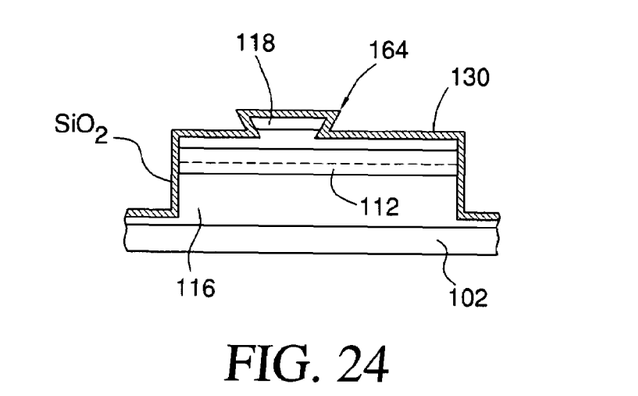
Figure 25:
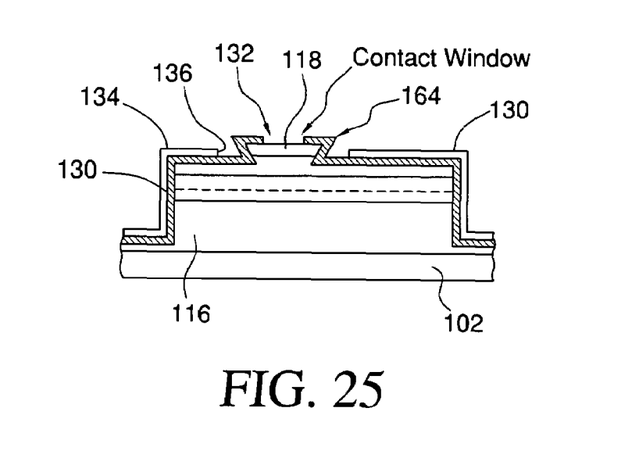
Figure 26:
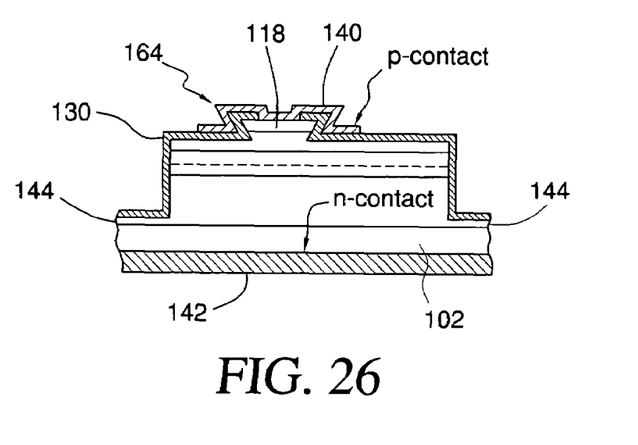

As illustrated in FIGS. 24-26, a p-contact is formed on the top surface of ridge 164 in the manner described above with respect to FIGS. 13, 15, and 17. To accomplish this, the remaining SiO$_2$ mask 168 is removed and the previously-described layer 130 of PECVD SiO$_2$ is deposited to encapsulate the structure, as shown in FIG. 24. Photolithography is used to define the position of the previously-described opening 132 on top of the ridge in a photoresist layer, and RIE is used to partially transfer the hole pattern from the photoresist into the SiO$_2$, as illustrated in FIG. 25, to form an SiO$_2$ mask. Residual SiO$_2$ is removed from the opening 132, using buffered HF, so that the highly doped surface of the upper cladding layer 118 of the nitride based laser structure is exposed. In this way, the RIE step does not damage the surface of the highly doped layer 118.

A p-contact 140 is deposited, using a metallization lift-off pattern 134 as shown in FIGS. 25 and 26, to cover the opening 132, and an n-contact 142 is either formed on the same side as the p-contact using metallization lift-off, or in the case that the substrate is conducting, is deposited on the back side of the wafer, as shown in FIGS. 17, 18, and 26. The edges 136 of the lift-off pattern define the p-contact.

As previously described, the p-contact may be formed in a two-step process where a first deposition of a metal, such as 30 nm of Ni followed by 30 nm of Au, is deposited over the opening through metallization lift-off. The first metal deposition is annealed, using a rapid thermal annealer (RTA) at 550° C. in an O$_2$ ambient, to form good contact with the nitride-based structure. Then a second deposition of metal, such as 15 nm of Ti, 500 nm of Pt, and 1000 nm of Au, is performed, also through metallization lift-off, to provide better conductivity of the p-metal as well as to provide a better base for wirebonding to the p-contact.

As described above, in order to get a good single mode laser, the ridge needs to be on the order of 1 μm in width, while a greater width is required for formation of a good p-contact. The dovetail shape of the ridge 164 accomplishes both goals by providing a ridge that is of the desired width $W_{base}$ at its base region 172, while the width $W_{top}$ of the top surface 162 is wide enough to produce a good p-contact.

Figure 27:
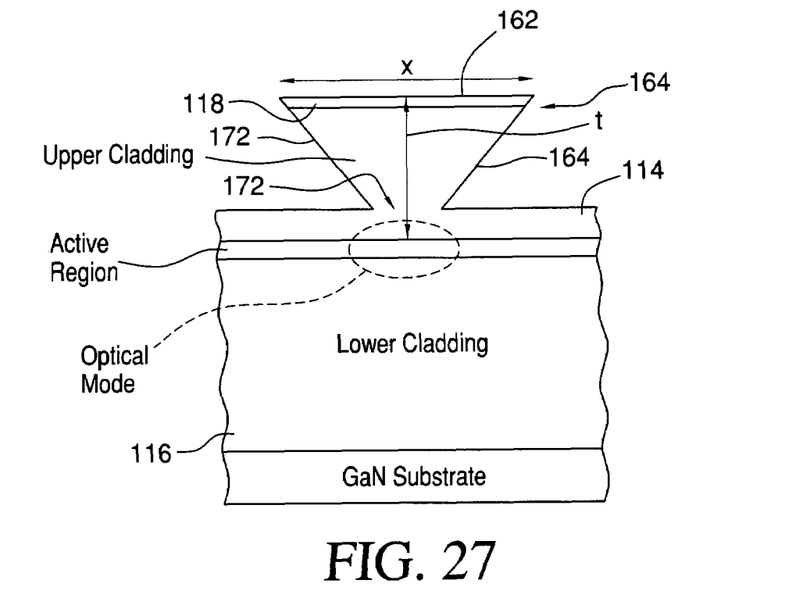
FIGS. 27 and 28 diagrammatically illustrate how different contact widths are obtained by varying the thickness of the top cladding layer.
Figure 28:
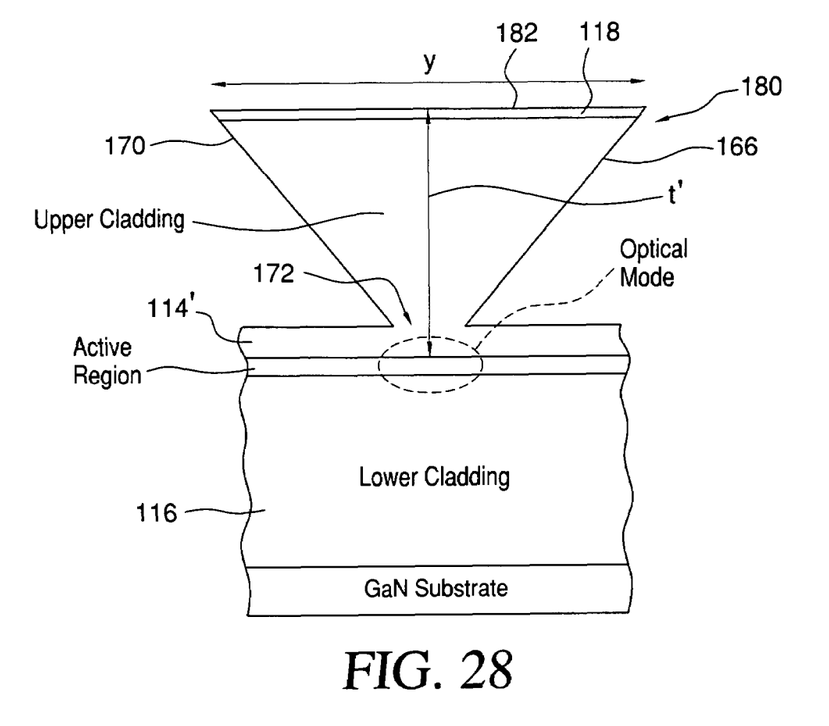

As illustrated in FIGS. 27 and 28, the width $W_{top}$ of the ridge can be varied by controlling the thickness t of the upper cladding layer 114 of the laser structure while using the same etch angle on both sides of the ridge. Thus, the thickness t for the upper cladding layer produces a top width x for ridge 164 (FIG. 27), while increasing the thickness of an upper cladding layer 114' of a similar dovetailed ridge illustrated at 180 in FIG. 28 to a thickness t' produces a top width y. Thus, the thicker layer 114 of ridge 180 in FIG. 28 produces a wider top surface 182 than is produced by the thinner layer 114 in FIG. 27, so that y>x, while both provide the same ridge base width 172.

Figure 29:
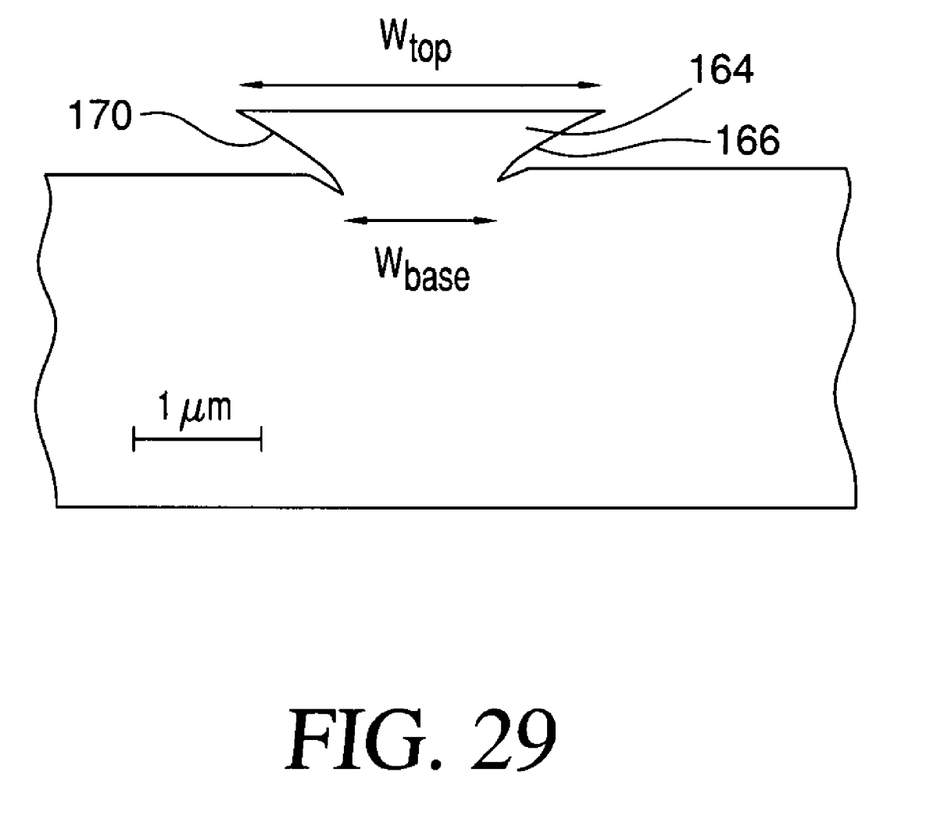
FIG. 29 is a diagrammatic illustration of a SEM view of a CAIBE etched ridge.

It has been found that the ridge material can be etched in CAIBE up to an ion beam stage tilt angle of about 70 degrees; at greater angles the etch rate drops rapidly. In practice, the etch will preferably be at an angle θ (FIG. 27) of between about 40 and about 70 degrees, with the thickness t of the upper cladding layer being increased to provide the desired contact width, as discussed above. The angled etch as seen in a SEM micrograph is depicted in FIG. 29, showing side wall angles obtained using two etches with an ion beam stage having positive and negative tilts of 65 degrees. The top width, $W_{top}$, of the dovetailed ridge is larger than that of the ridge base width, $W_{base}$. The dovetail ridge is particularly important for short cavity blue lasers, since the shorter devices have higher contact resistance than do longer devices.

Although the dovetail shaped ridge has been described with respect to etched facets, such a ridge also provides benefit to lasers with cleaved facets.

A significant factor affecting the yield and cost of AlGaInN-based blue lasers is the lack of availability of laser quality material with low defect density. A few research labs have developed techniques such as epitaxial lateral overgrowth (ELOG) on sapphire while others have developed GaN substrates that have improved the defect density to the $10^5/cm^2$ level. Because of the difficulty in cleaving, described previously, the minimum cavity length that can be realistically fabricated using that procedure is on the order of 600 μm. The use of etched facets in place of mechanically cleaved facets allows the formation of shorter cavity devices of 100 μm or less, and this ability to make shorter cavity devices results in the probability of having fewer defects per device and hence much higher yield. These shorter lasers may have a lower maximum power rating than longer cavity devices; however, the vast majority of lasers will be used in next generation DVD read-only applications, where lower power is sufficient and the lowest cost and lowest power consumption will be needed. The specific fabrication, integration and full wafer testing capabilities enabled by EFT will also provide significant benefits to the fabrication of high-power GaN lasers for writable optical disk applications.

Although the present invention has been illustrated in terms of preferred embodiments, it will be understood that variations and modifications may be made without departing from the true spirit and scope thereof as set out in the following claims.

What is claimed is:

1. A semiconductor laser, comprising:
    a substrate;
    an AlGaInN based laser structure deposited on said substrate, said laser structure including an active region; and
    a dry etched ridge located between first and second dry etched end facets, said ridge having a base disposed on said laser structure above said active region, a top surface, first and second inwardly sloped side walls and a dovetail-shaped cross-section.

2. The semiconductor laser of claim 1, wherein said etched end facets and said side walls are formed in a dry etching system containing an ion beam source generating an ion beam directed towards said substrate, said substrate being positioned at angles other than that of perpendicular incidence to said ion beam during the dry etch of said side walls.

3. The semiconductor laser of claim 2, wherein said first end facet is positioned at or around a 90-degree angle to said substrate and said second end facet is positioned at or around a 90-degree angle to said substrate.

4. The semiconductor laser of claim 3, wherein said side walls are etched at or about a 45-degree angle to the substrate.

5. The semiconductor laser of claim 3, wherein each of said side walls is etched at an angle of between about 40 and about 60 degrees with respect to the substrate.

6. An AlGaInN based semiconductor laser, comprising:
    a substrate;
    a lower cladding layer;
    an active region;
    an upper cladding layer; and
    a ridge located in said upper cladding layer between first and second end facets and having first and second inwardly sloped side walls to form a ridge having a top surface and a base and a dovetail-shaped cross-section, said base being disposed above said active region.

7. The laser of claim 6, wherein the relative widths of the top surface and the base of said ridge are dependent on the depth of the side walls in the upper cladding layer.

8. The laser of claim 6, wherein said facets are cleaved.

9. The laser of claim 6, wherein said facets are etched.

* * * * *